United States Patent
Ballentin et al.

(10) Patent No.: US 6,788,115 B2
(45) Date of Patent: Sep. 7, 2004

(54) FAST SAMPLE-AND-HOLD PEAK DETECTOR CIRCUIT

(75) Inventors: Ralph Ballentin, Birkenwerder (DE); Frank Ilchmann, Berlin (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/601,865

(22) Filed: Jun. 24, 2003

(65) Prior Publication Data

US 2004/0027174 A1 Feb. 12, 2004

(30) Foreign Application Priority Data

Jul. 26, 2002 (EP) ............................................. 02360224

(51) Int. Cl.$^7$ .............................................. G11C 27/02
(52) U.S. Cl. ...................................................... 327/94
(58) Field of Search .............................. 327/91, 94, 96,
327/33, 37, 45, 309, 317, 321, 378; 341/122

(56) References Cited

U.S. PATENT DOCUMENTS

| | | | |
|---|---|---|---|
| 4,038,568 A | | 7/1977 | May et al. |
| 5,289,278 A | * | 2/1994 | Bird ............................ 348/473 |
| 5,986,481 A | | 11/1999 | Kaminishi |
| 5,995,166 A | | 11/1999 | Kawano |
| 6,028,459 A | * | 2/2000 | Birdsall et al. ................ 327/94 |
| 6,034,556 A | * | 3/2000 | Koyasu et al. ................. 327/96 |
| 6,144,234 A | * | 11/2000 | Nakamura ..................... 327/94 |
| 6,489,814 B2 | * | 12/2002 | Hoogzaad et al. ............. 327/94 |

OTHER PUBLICATIONS

Patent Abstracts of Japan, vol. 1999, No. 01, Jan. 29, 1999 corresponding to JP 10 67967 A Toshiba Corp Oct. 9, 1998.
Patent Abstracts of Japan, vol. 007, No. 234, Oct. 18, 1983 corresponding to JP 58 122698 A (Sony KK) Jul. 21, 1983.

* cited by examiner

*Primary Examiner*—My-Trang Nuton
(74) *Attorney, Agent, or Firm*—Sughrue Mion, PLLC

(57) ABSTRACT

This invention relates to circuitry for detecting peak levels of signals and particularly fast hold and sample peak detectors for analyzing signals of generally arbitrary wave shape and form having a high precision, high slew-rate, very short retention, and a low distortion. The circuitry comprising a comparator circuit comprising two signal inputs and a signal output, where the output signal depends from the difference between the input signals, a sample and hold circuit comprising switching means controlled by said signal output for sampling and holding means for holding the output signal, a compensation circuit for compensating residual currents comprising emulating means for emulating residual currents caused by said comparator circuit influencing the functionality of said sample and hold circuit, and an unload circuit comprising a clearing means for decreasing the output signal of said sample and hold circuit.

9 Claims, 5 Drawing Sheets

FAST SAMPLE-AND-HOLD PEAK DETECTOR CIRCUIT

BACKGROUND OF THE INVENTION

1. Field of the Invention

This invention relates to circuitry for detecting peak levels of signals and particularly fast sample-and-hold peak detectors for analyzing signals of generally arbitrary wave shape and form having a high precision, high slew-rate, very short retention, and a low distortion.

The invention is based on a priority application, EP 02360224.6, which is hereby incorporated by reference.

2. Background

Peak signal detectors are widely known and useful circuit devices. A peak detector may be used in an analog-to-digital signal converter, as a demodulator, or as a diagnostic tool.

Various circuit solutions have been suggested for providing peak signal indications. Among them are peak envelope detectors, sample-and-hold peak detector circuits and level sensing circuits. Known solutions have a wide variety of limitations and disadvantages, including limitations on large amplitude operating range and frequency range and inability to approach true peak level detection.

What is needed is a peak detector which approaches true peak detection over a wide frequency range with high precision, high slew-rate, very short retention, and a low distortion.

A technique of detecting an analog signal at high speed and converting it into a digital signal has recently been essential to networking and multimedia. There a sample-and-hold peak detector circuit is necessary for an analog-to-digital conversion. As one method of the sample-and-hold peak detector circuit, there is a combination of a high-speed switch circuit and a voltage holding capacitor, for catching analog signals sampled in a short time slot and holding their peak values.

For circuits processing digital signals only, and circuit for optical telecommunications and optical interconnects, for signal readout circuits for a magnetic memory and semiconductor memory, and the like, the input signal levels of which are varied and unclear, for all these circuits, it is important that an input signal level of the preamplifier is detected automatically to determine the optimum operation point and minimize a distortion of waveform of a reproduced pulse.

In order to minimize the distortion, an automatic discrimination type waveform reproduction circuit has been employed which detects and normalizes a peak level of an input pulse signal to always discriminate the pulse signal by half the amplitude of the pulse signal irrespective of variations in the level of the input pulse signal.

Peak detectors are also used for signal surveillance. For instance, input loss of signal (ILOS) detection is crucial for a wide range of devices. Here a peak detector is used to indicate whether a signal is absent by detecting no peaks.

It is a sample-and-hold peak detector circuit that is important in common to the foregoing examples. In particular, it is desirable for a circuit for processing a signal with an arbitrary pattern, such as the optical interconnection, to respond to a burst waveform and it is important to respond at high speed of not less than nanoseconds in order to correctly detect and hold a peak value of the first-input pulse. Recently there have been great demands that the sample-and-hold peak detector circuit should be relatively small in size or compact so as to be incorporated into an IC without any external capacitor. Also there have been demands for low power consumption in order to incorporate the sample-and-hold peak detector circuit into a multi-channel array, as well as a demand for a compensation of the technology dependent charging and discharging current. A further demand is the technology independence as well as the temperature and power supply independence of the sample-and-hold characteristics. In U.S. Pat. No. 5,986,481 Kaminshi describes the fundamental arrangements of known prior art sample-and-hold peak detector circuits, illustrated in FIG. 1 and FIG. 2. The operation principle of each circuit is as follows. In the circuit of FIG. 1, a pulse input to an input terminal of a differential amplifier constituted of transistors T1 and T2, is compared with an output voltage of the sample-and-hold peak detector circuit and, if the voltage of the input pulse is higher than the output voltage with respect to Vee, an error is amplified and the base voltage of a switching transistor T3 is increased. Transistor T3 is turned on to start discharging a voltage holding capacitor C1. When the output voltage of the emitter follower circuit of a transistor T4 reaches the voltage of the input peak, the base voltage of the transistor T3 is lowered to cut off the current flowing into the transistor T3. If the top voltage of the input pulse is maintained until the current is cut off the voltage with which the voltage holding capacitor C1 is discharged, becomes equal to the peak voltage of the input pulse.

Since the leak peak current of the transistor T4 is low, the time constant of charging of the capacitor is large and its peak voltage is maintained.

The operation of the switching transistor T3 will be described in more detail. The transistor T3 is a bipolar transistor and thus has a characteristic of causing a current to flow exponentially with respect to a base-to-emitter voltage. When the amplitude of base-to-emitter voltage is small, the dynamic impedance is high, the injected current is small, and the peak transit time is long. On the other hand, when the amplitude exceeds a certain value, the impedance is drastically lowered and the charging time is too short, with the result that a feedback is delayed and so is the cutoff of the switching transistor, thus causing an overshoot of the output voltage.

Consequently, an input voltage range for normally operating the circuit is restricted, and it is difficult to widen an input dynamic range. If the input voltage is too high, a collector current may flow through the transistors beyond a tolerable range, and the cutoff frequency may decrease, thereby causing a delay in response.

A circuit capable of excluding the above drawbacks to some extent, is shown in FIG. 2. In the circuit of FIG. 2, the voltage holding capacitor C1 is charged with a current which is almost proportional to the amplitude of an error voltage by a current output amplifier using a PNP transistor in place of a switch of an NPN transistor (shown in FIG. 1) with drastically changing impedance. In the circuit of FIG. 2, a power supply voltage needs to be higher than that of the circuit of FIG. 1 and the PNP transistor should satisfy a high speed operation.

In general, however, the bandwidth of the PNP transistor is about one-tenth of that of the NPN transistor; thus, the circuit of FIG. 2 has an essential problem that a high-speed operation cannot be satisfied.

The problem of the circuit shown in FIG. 1 on principle is an exponentially, nonlinear response to an input voltage of a switching transistor. However, this problem can be resolved if, as in the circuit of FIG. 2, the NPN switching transistor is operated so as to exhibit a linear response to the input voltage.

A high gain feedback amplifier may be useful for the sample-and-hold peak detector circuit in order to linearly operate an element originally having a remarkably nonlinear characteristic. In this case, usually, there occurs a problem that a high-speed operation cannot be carried out due to a delay in a high gain feedback as well as a problem that a large-sized circuit increases in chip area and thus in power consumption.

BRIEF DESCRIPTION OF THE INVENTION

The invention is based on the idea of definable matching characteristics, i.e. definable time parameter via discharge current compensation and defined constant current sources.

The circuit according to the invention consists of four coupled parts: a comparator circuit, a sample and hold circuit, a compensation circuit, and an unload circuit.

The circuitry for generating an output signal representative of peak level signals over a wide frequency range according to the invention comprises a comparator circuit at a first control input to receive an arbitrary input signal and providing a fixed reference signal for comparison with a varying signal across a charge stored in a sample and hold circuit. The circuitry further comprises a switch coupled to the comparator for controlling a first current for charging the sample and hold circuit, and a compensation circuit for compensation of residual currents. Furthermore the circuitry comprises an unload circuit for allowing controlling the de-charging characteristic.

OBJECTS AND ADVANTAGES OF THE INVENTION

The invention is a sample-and-hold peak detector circuitry comprising a comparator circuit comprising two signal inputs and a signal output, where the output signal depends on the difference between the input signals; a sample and hold circuit comprising switching means controlled by said signal output for sampling and holding means for holding the output signal; a compensation circuit for compensating residual currents comprising emulating means for emulating residual currents caused by said comparator circuit influencing the functionality of said sample and hold circuit, and an unload circuit comprising a clearing means for decreasing the output signal of said sample and hold circuit, wherein said compensation circuit comprises copies of parts of the comparator circuit as emulating means.

The compensation circuit might comprising a current mirror circuit mirroring residual currents emulated by said emulating means. And it might comprising copies of parts of the comparator circuit as emulating means.

The unload circuit might comprising a constant current source. This constant current source might be an adjustable constant current source. And it might be realized by multiple switchable constant current sources. The switchable constant current sources might be switchable by transfer gates.

The comparator circuit is implemented in differential logic. And the comparator circuit comprising of an current switch and a constant current source. The differential logic is differential emitter coupled logic.

Accordingly, it is an object and advantage of the present invention to provide a particularly fast sample-and-hold peak detector for analyzing signals of generally arbitrary wave shape and form having a high precision, high slew-rate, very short retention, and a low distortion.

These and other objects and advantages of the present invention will become apparent to those of ordinary skill in the art from a consideration of the drawings and ensuing description.

BRIEF DESCRIPTION OF THE FIGURES

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
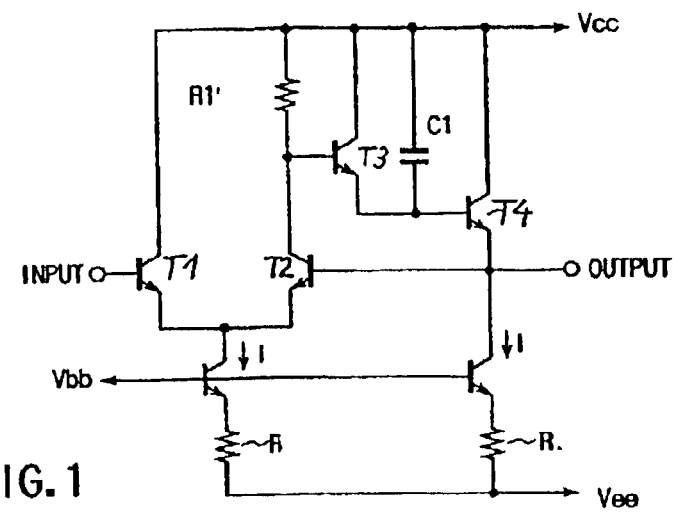
FIG. 1 is a circuit diagram showing an example of a prior art sample-and-hold peak detector circuit.
Figure 2:
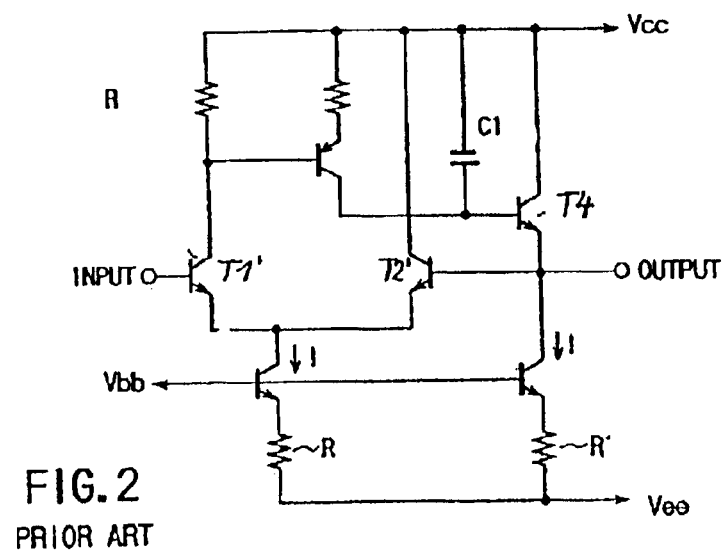
FIG. 2 is a circuit diagram showing another example of the prior art sample-and-hold peak detector circuit.
Figure 3:
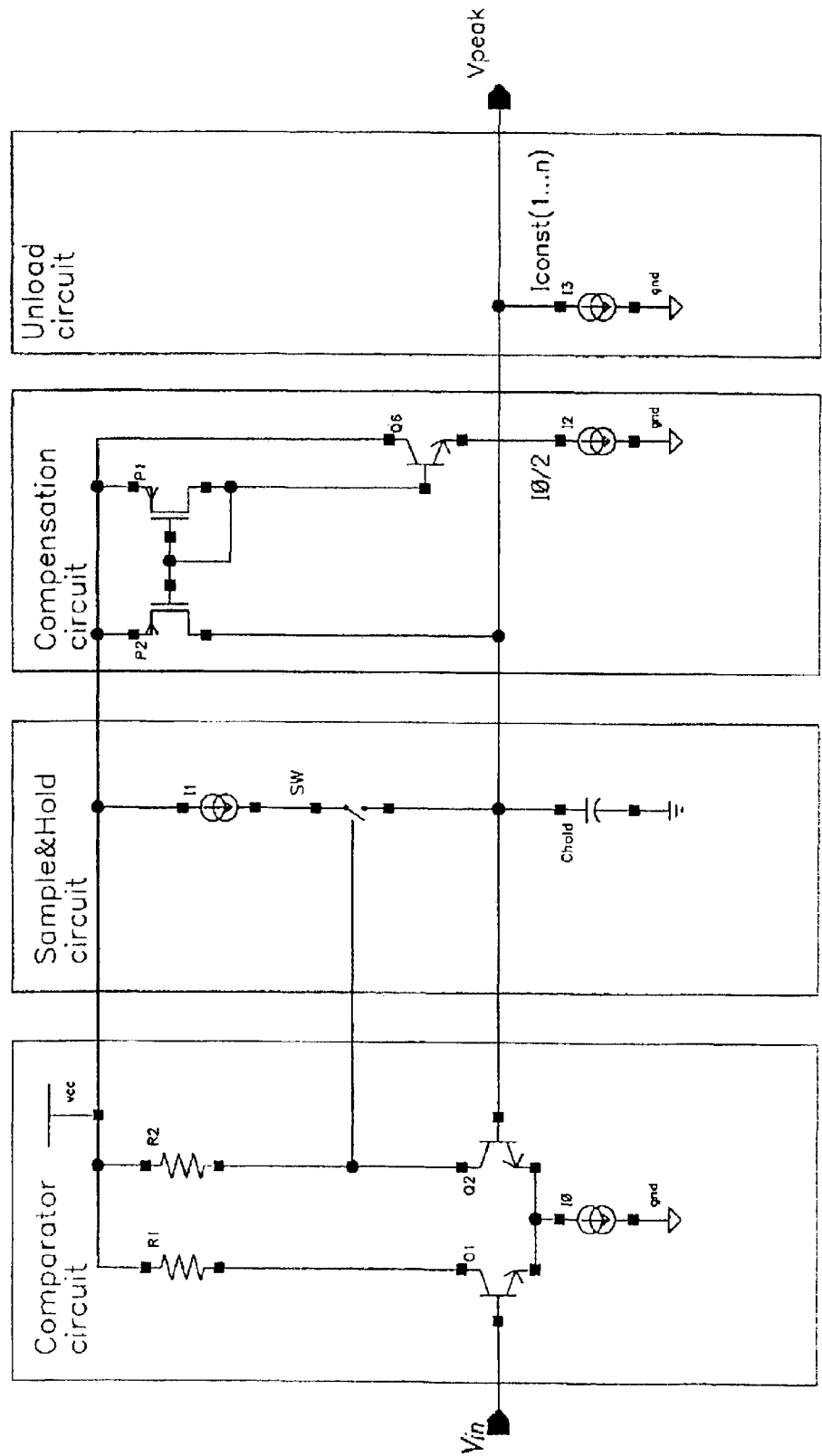
FIG. 3 is a circuit diagram illustrating a sample-and-hold peak detector circuit of the present invention.

FIG. 3 shows principle circuit diagram of a sample-and-hold peak detector according to the invention. The diagram consists of four parts: a comparator 'Comparator circuit', a sample-and-hold circuit 'Sample&Hold circuit', a compensation circuit 'Compensation circuit', and an unload circuit 'Unload circuit'.

The comparator 'Comparator circuit' consists of an current switch implemented with two bipolar transistors Q1 and Q2, two resistors R1 and R2, and a constant current source I0.

The sample-and-hold circuit 'Sample&Hold circuit' consists of a charging current source I1, an electronic switch SW, as well as a capacity Chold.

The compensation circuit 'Compensation circuit' consists of a current mirror implemented with two positive channel Field Effect Transistors (pFETs) P1 and P2, as well as a bipolar transistor Q6, and a constant current source I2 serving half of the current of I0.

The unload circuit 'Unload circuit' consists of multiple constant current sources for determining the de-charging current of the capacity.

The 'Comparator circuit' building a voltage comparator, comparing the input signal voltage Vin with the output signal voltage Vpeak. Supposing the capacity Chold is uncharged. If Vin is greater than Vpeak, the electronic switch SW will be closed. This has the effect that the capacity Chold will be loaded by a switchable current source I1, and the potential at the output will increase, the comparator will detect if Vpeak has reached Vin and shall release the electronic switch SW. The voltage Vpeak remains stored by the capacity Chold. The procedure iterates if, Vin is greater than Vpeak.

The characteristic for unloading of the hold voltage Vpeak (in case of an open electronic switch SW) is determined by the base current of transistor Q2 and the capacity Chold.

The 'Compensation circuit' has the functionality to compensate the base current of transistor Q2 de-charging the capacity Chold. Therefore, the base current of transistor Q6 is mirrored by the transistors P1 and P2 for charging the capacity Chold. The current through P2 is identical with the base current of transistor Q6 over the transistor P1, if P1 and P2 are identical as well as if Q2 and Q6 are identical, and the constant current source I2 serves the halve of the current of I0. This compensation is necessary because otherwise the base current of Q2 will uncontrolled unload the capacity Chold inhibit to define an exact de-charging time.

The 'Unload circuit' determines exactly the de-charging of the capacity Chold by the constant current source I3, serving currents Iconst (1 . . . n).

Figure 4:
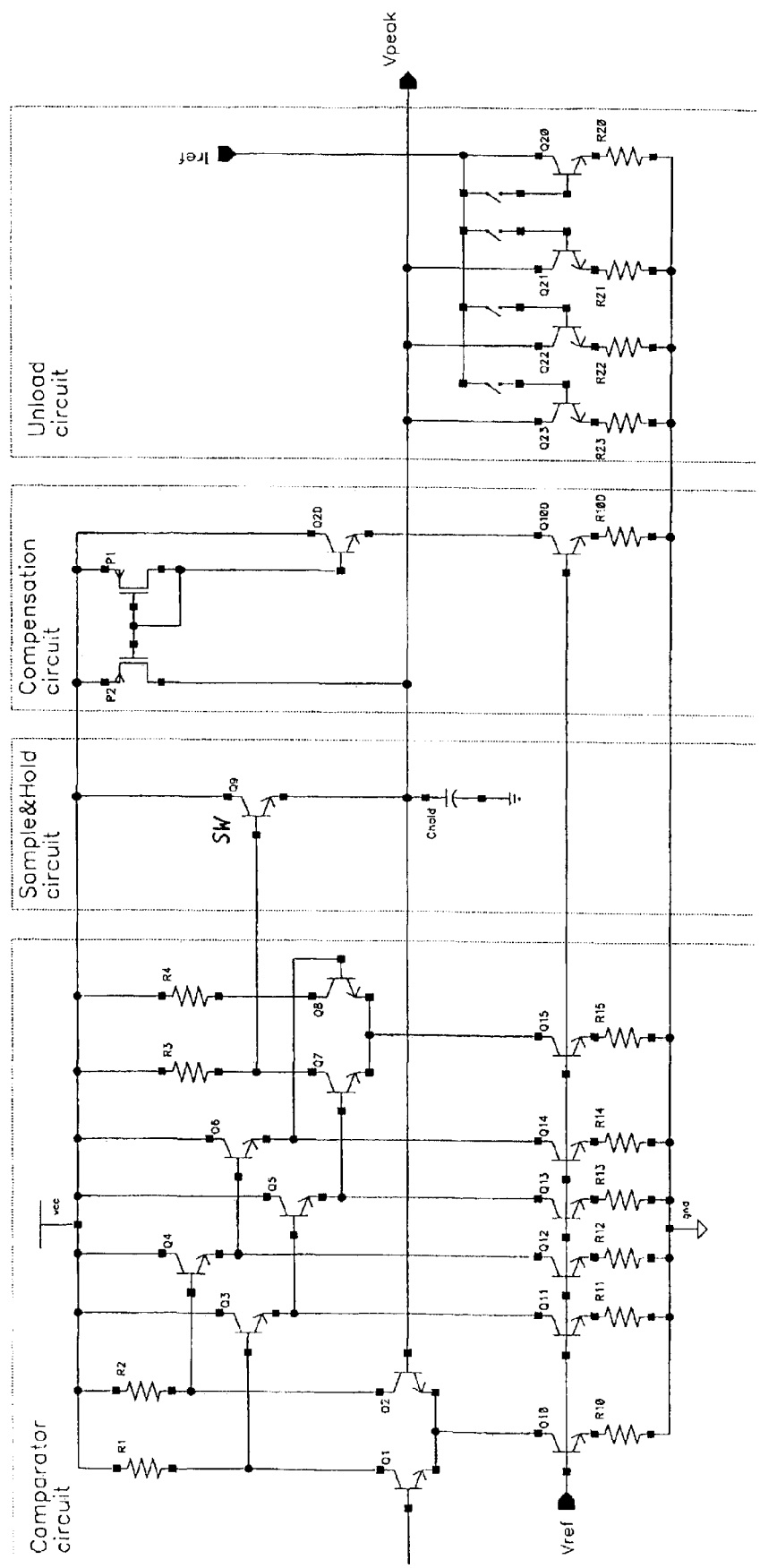
FIG. 4 is a circuit diagram illustrating an example of a sample-and-hold peak detector circuit according the present invention.

FIG. 4 shows a detailed circuit diagram of a sample-and-hold peak detector according to the invention. The four parts of the principal circuit diagram: 'Comparator circuit', 'Sample&Hold circuit', 'Compensation circuit', and 'Unload circuit' are detailed.

The 'Comparator Circuit' consists of a two-stage bipolar amplifier to ensure the comparator functionality. This has the effect of high precision and low overshoot. The first stage is realized by the transistors Q1 and Q2 and the collector resistors R1 and R2. Transistor Q10 and resistor R10 are designed to be the current source of the amplifier. The second stage consists of the transistors Q7 and Q8 and the collector resistors R2 and R4. Transistor Q15 and Resistor R15 are forming the current source of the second stage. Both amplifier stages are coupled via emitter-followers. A first emitter-follower pair consists of the transistors Q3 and Q4 with the current sources implemented by the transistors Q11 with resistor R11 and transistor Q12 with resistor R11. A second emitter-follower pair consists of the transistors Q5 and Q6 as well as the corresponding current sources, formed by transistor Q13 and resistor R13 as well as transistor Q14 and resistor R14.

The 'Sample&Hold circuit' comprises a transistor Q9 and the capacity Chold. Transistor Q9 works as a switch triggered by the output voltage of the 'Comparator circuit' (collector of Q7). By using a bipolar transistor a high slew rate is achieved.

The 'Compensation circuit' is realized by a current mirror P1 and P2 as well as the bipolar transistor Q2D having a current source Q10D with R10D. The current source has half of the value of the current source Q10 with R10. This ensures that the capacity Chold is charged with the current flowing of through the basis of transistor Q2.

The 'Unload circuit' comprises multiple current sources Q23 with R23, Q22 with R22, Q21 with R21, and Q20 with R20. The current sources are defined by a reference current Iref unloading well defined the capacity Chold. The switches for selecting the unloading current might be implemented by transfer gate switches.

Figure 5:
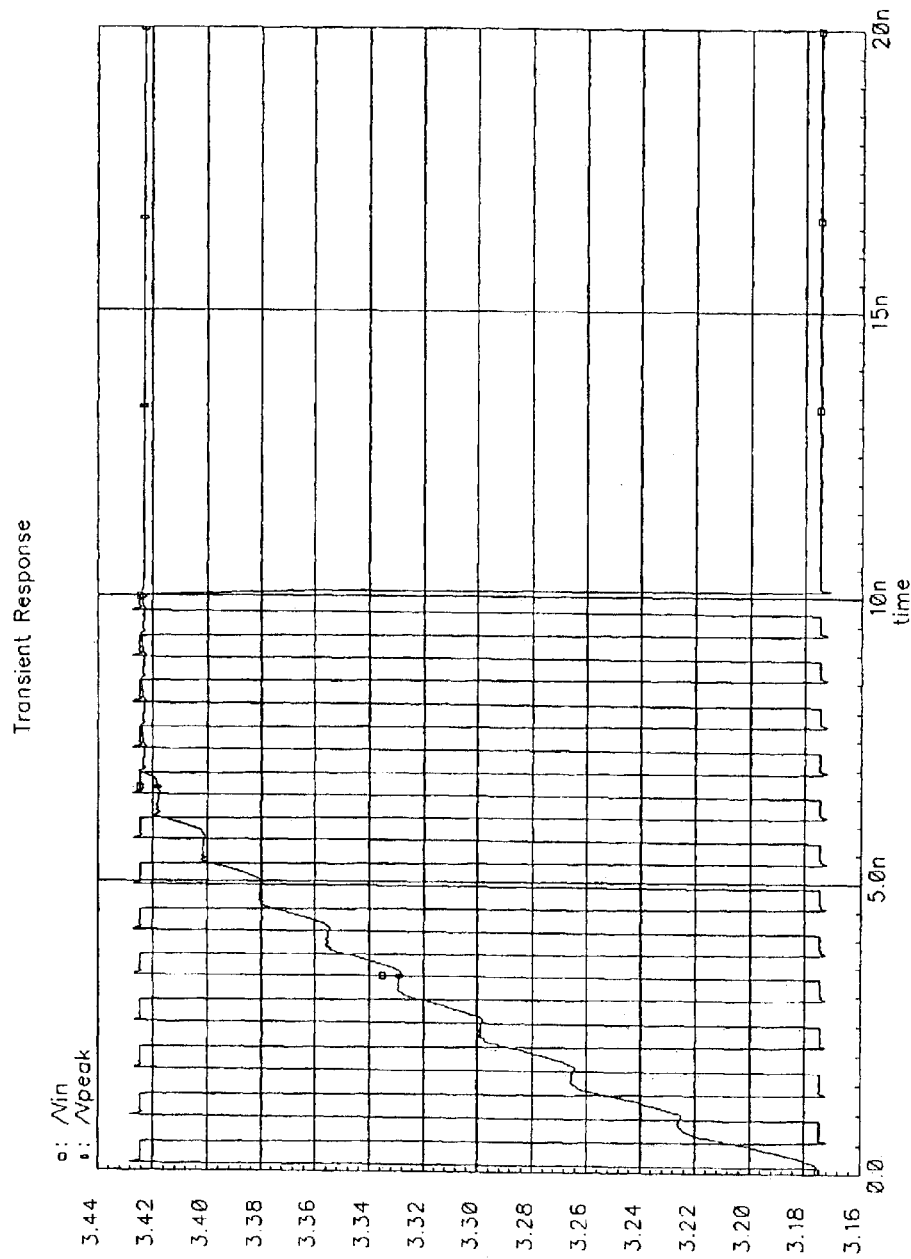
FIG. 5 is a diagram showing the output voltage of a sample-and-hold peak detector circuit with a large hold time according to the present invention.

FIG. 5 shows the output voltage of a sample-and-hold peak detector circuit according to the present invention with a large hold time; realized by a small de-charging current. The peak detector reaches within c.a. 7 ns the peak value of the input signal and holds this value for further 10 ns even without new input.

Figure 6:
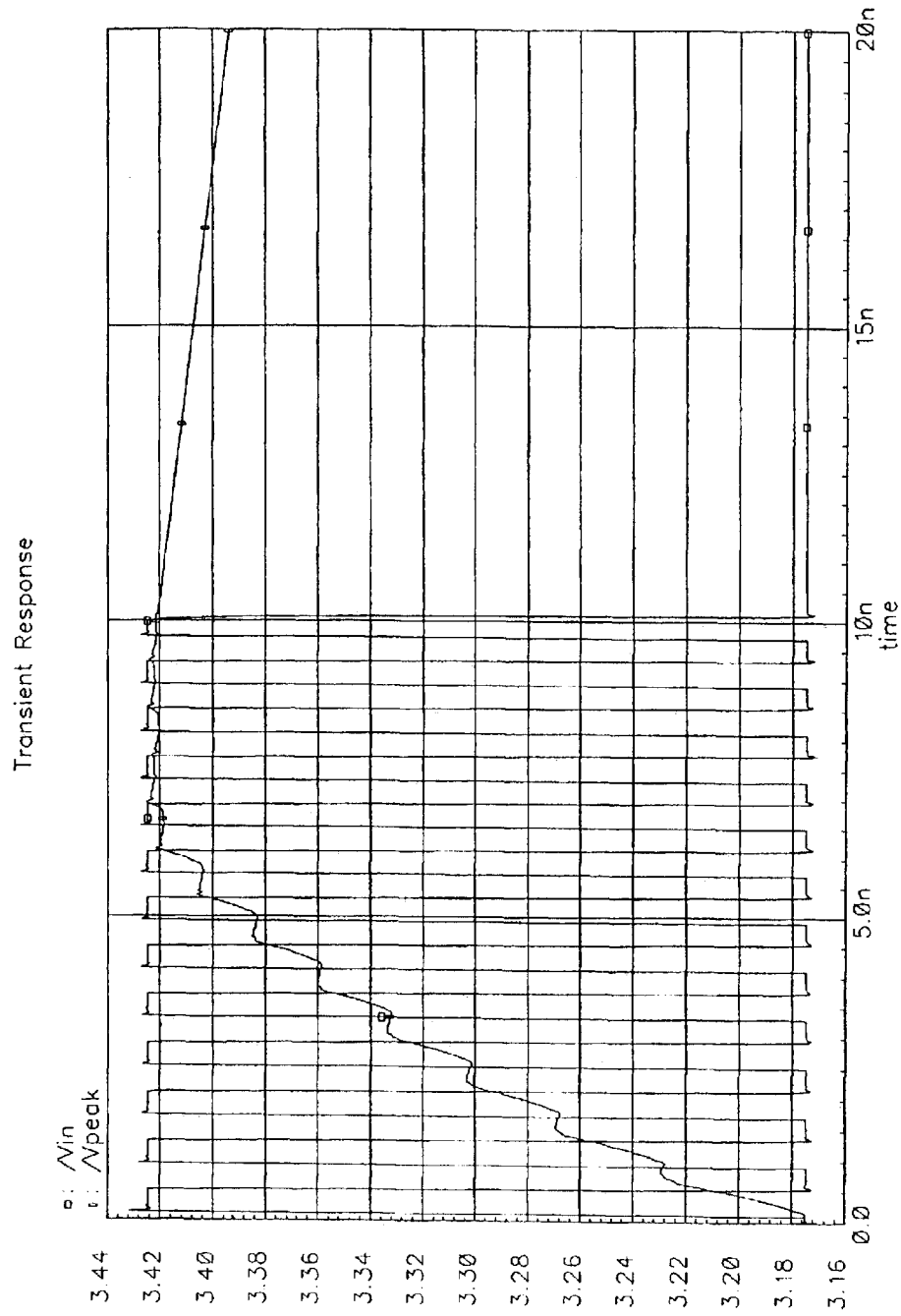
FIG. 6 is a diagram showing the output voltage of a sample-and-hold peak detector circuit with a small hold time according to the present invention.

FIG. 6 shows the output voltage of a sample-and-hold peak detector circuit according to the present invention with a large hold time; realized by a large de-charging current. The peak detector reaches within c.a. 7 ns the peak value of the input signal but the output voltage is decreasing now immediately. After further 10 ns the output voltage has decreased from 3.42V below 3.40V.

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application.

For example, the invention can be used with any type of transistor technology and semiconductor technology. The invention, therefore, is not intended to be limited except in the spirit of the appended claims.

What is claimed is:

1. A sample-and-hold peak detector circuitry comprising a comparator circuit comprising two signal inputs and a signal output where the output signal depends on the difference between the input signals, a sample and hold circuit comprising switching means controlled by said signal output for sampling and holding means for holding the output signal, a compensation circuit for compensating residual currents comprising emulating means for emulating residual currents caused by said comparator circuit influencing the functionality of said sample and hold circuit, and an unload circuit comprising a clearing means for decreasing the output signal of said sample and hold circuit, wherein said compensation circuit comprises copies of parts of the comparator circuit as emulating means.

2. The circuitry according to claim 1 wherein said compensation circuit comprises a current mirror circuit mirroring residual currents emulated by said emulating means.

3. The circuitry according to claim 1 wherein said unload circuit comprises a constant current source.

4. The circuitry according to claim 3 wherein said constant current source is an adjustable constant current source.

5. The circuitry according to claim 4 wherein said adjustable constant current source is realized by multiple switchable constant current sources.

6. The circuitry according to claim 5 wherein said switchable constant current sources are switchable by transfer gates.

7. The circuitry according to claim 1 wherein said comparator circuit is implemented in differential logic.

8. The circuitry according to claim 1 wherein said comparator circuit comprises a current switch and a constant current source.

9. The circuitry according to claim 7 wherein said differential logic is a differential emitter coupled logic.

* * * * *